United States Patent [19]

Kent

[11] 4,397,341
[45] Aug. 9, 1983

[54] METHOD AND APPARATUS FOR STRAIGHTENING AN ARRAY OF TERMINAL PINS

[75] Inventor: William C. Kent, Garland, Tex.

[73] Assignee: Western Electric Company, Inc., New York, N.Y.

[21] Appl. No.: 305,673

[22] Filed: Sep. 25, 1981

[51] Int. Cl.³ .............................................. B21F 1/02
[52] U.S. Cl. ...................................... 140/147; 29/845
[58] Field of Search .................. 140/147; 72/383, 384, 72/386; 29/842, 845

[56] References Cited

U.S. PATENT DOCUMENTS 3,730,234 5/1973 Hesselmann ........................ 140/147
3,871,424 3/1975 Slana .................................... 140/147

OTHER PUBLICATIONS

Bulletin 37-D1, pp. 4 and 5; TAFA-An Ionarc Co.

Primary Examiner—Francis S. Husar
Assistant Examiner—Linda McLaughlin
Attorney, Agent, or Firm—R. P. Miller

[57] ABSTRACT

A coordinate array of terminal pins are straightened and aligned in precise rows and columns by flexing one-half of the pins in one direction while flexing the other half of the pins in an opposite direction. This coordinate alignment is attained by inserting first rows of pins (13) into apertures (31) formed in a first set of slide bars (36) and second rows of pins (13) into apertures (32) formed in a second set of slide bars (37) which are interleaved with the first bars. A pair of air cylinders (81 and 89) are programmed to operate to reciprocate the slide bars (36 and 37) in opposite directions to flex the terminal pins beyond elastic limits and back to their origin point. The flexing operation is effective to align the pins in a coordinate array without introduction of detrimental stresses in a terminal pin support, such as a connector housing (11) or a printed circuit board (102).

20 Claims, 6 Drawing Figures

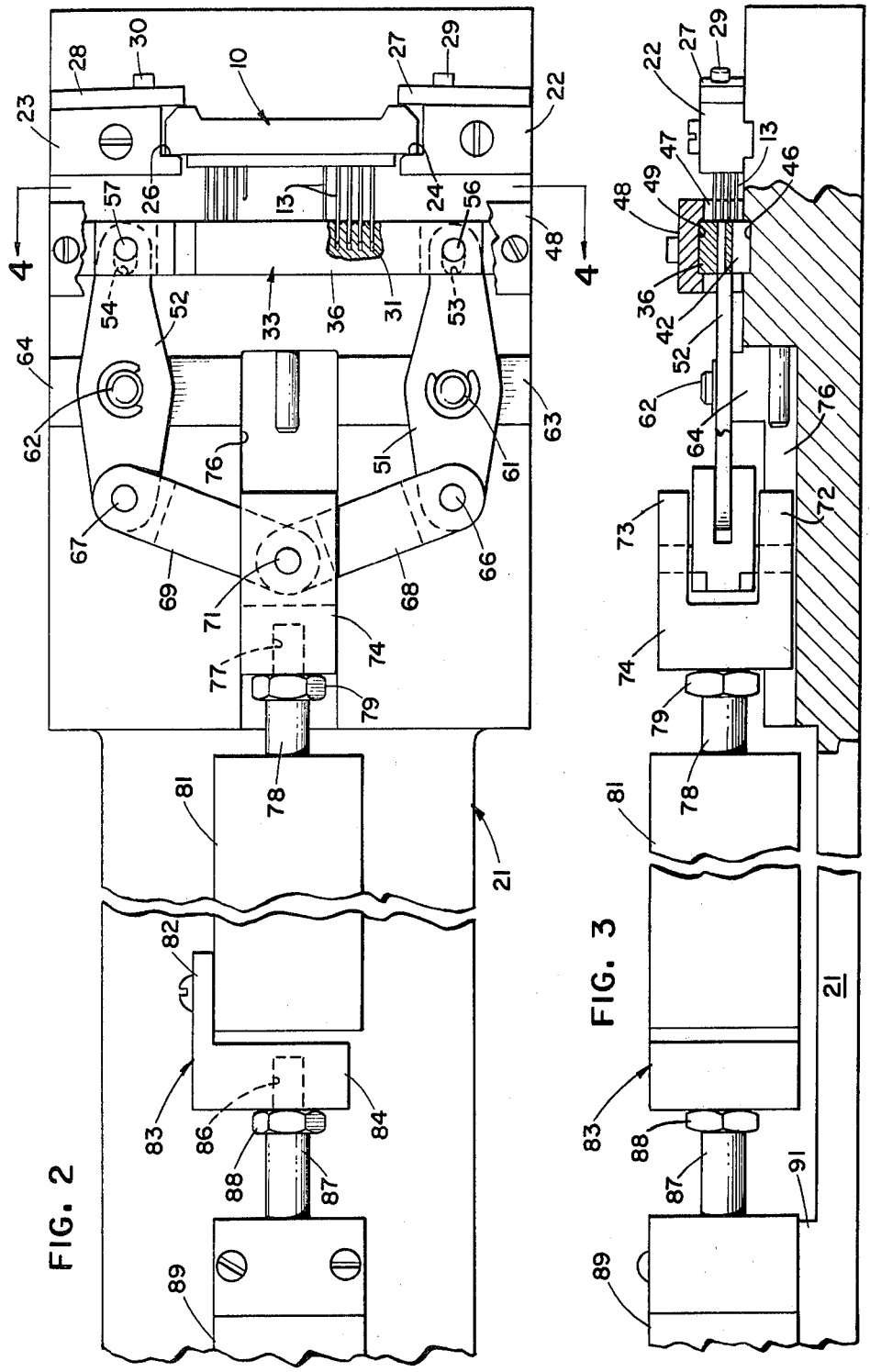

4,397,341

METHOD AND APPARATUS FOR STRAIGHTENING AN ARRAY OF TERMINAL PINS

FIELD OF THE INVENTION

This invention relates to a method and apparatus for bending and straightening an array of terminal pins projecting from a support without introducing detrimental stresses in the pin support or mounting and, more particularly, to a method and apparatus for straightening pins by applying forces to bend a first sub-set of the pins in a first direction while simultaneously bending the remaining set of pins in a second, opposite direction, and then reversing the direction of the bending forces to bend the respective sets of pins to effectuate a straightening of all of the pins.

BACKGROUND OF THE INVENTION

Arrays of parallel terminal pins projecting from a support member find widespread use in many sophisticated electronic or solid state assemblies. In some instances, the arrays of terminal pins are utilized in the construction of printed circuit board assemblies. Such arrays of terminal pins are utilized to provide interconnections between different circuit paths formed on individual circuit boards that are laminated to provide a composite multi-layer board. The array of terminal pins on such circuit boards provide, or may provide, mountings for circuit components secured to the terminal pins. In other utilizations, the pins may provide the electrical connection between circuit paths on the board to wires laid and routed about and between the terminal pins.

In other instances, coordinate arrays of terminal pins are utilized in the manufacture of connectors wherein a coordinate array of pins project from a housing which contains a socket for receiving an end section of a circuit board having edge connectors or contacts. Groups of connectors of this type are often mounted in a common plane within a frame to form what is known as a backplane of an electronic or solid state equipment. One example of this type of equipment is the electronic switching frames presently being used in the telephone industry. When the connectors are mounted to form a backplane, the projecting terminals are utilized as the connect means to wired harnesses. In other instances, the terminals act as plugs on which backplane connectors are mounted to interconnect the terminal pins with other circuit assemblies.

Whether the arrays of terminals are to be wired or received in connectors, it is necessary that the terminals be straight and parallel. This requirement is particularly stringent when the wiring of the terminals is to be accomplished in an automatic wiring machine where wire routing and wrapping facilities depend upon the presence of straight parallel arrays of terminal pins.

One technique for straightening a coordinate array of pins contemplates bending the pins in a common direction beyond the elastic limit of the pin material, and then bending the pins in an opposite direction to again stress the pins beyond their elastic limits to impart a reset which is only sufficient to return the pins to straightened vertical positions when the pins are released. Subsequent thereto, bending forces may be applied in directions orthogonal to the first bending directions so that the rows and columns of pins are in an exact coordinate array.

Many equipments have been divised and are available to effectuate the reverse bending of arrays of terminal pins to attain a desired degree of straightness and alignment of the pins. An example of one such apparatus is disclosed in U.S. Pat. No. 3,730,234 issued May 1, 1973, to P. G. Hesselmann wherein an array of terminal pins extending through a printed circuit board are straightened by the reverse bending techniques. In the patented apparatus, a circuit board is supported in a tray having a floating lid in which there is formed an array of apertures corresponding to the array of terminals to be straightened. The terminals are received in the lid apertures and the tray is moved into a pin straightening machine whicn includes facilities for reciprocating the floating lid to bend the pins in opposite directions beyond the elastic limits. Next, the tray is withdrawn, rotated 90° and then placed back in the machine where another bending cycle is executed to bend the pins in directions orthogonal to the first bending directions.

In general, these prior art terminal pin straightening techniques and devices execute cyclic bending in common directions; that is, all of the pins are bent in a first direction and then all of the pins are bent in a second, reverse direction. It is apparent that when the bending forces are applied in a common direction there are large forces imparted to the pin supports or mounting. If the terminal pins extend from a printed circuit board, there are tendencies to bend or bow the board. If the terminal pins extend from a connector housing, detrimental stresses are set up in the components of the connector housing.

SUMMARY OF THE INVENTION

This invention contemplates, among other things, a method and apparatus for straightening an array of pins extending in parallel relation from an article wherein a portion of the pins are bent beyond elastic limits in a first direction while the remainder of the pins are bent beyond elastic limits in a second opposite direction.

More particularly, the invention features a pair of sets of slide devices, each set of which includes a number of parallel slide bars having a column of terminal pin receiving holes. The bars are mounted in an interleaved relation for relative longitudinal reciprocating motion. The article is supported with columns and rows of pins extending into the holes or the article is mounted so that the pins extend into and abut the bottom of the holes to support the article.

Actuating forces are applied to reciprocate the slides so that the respective sets of slides move in opposite direction to initially bend the pins beyond their elastic limits, whereafter the pins are bent in opposite directions past the initial positions for distances of less than one-half the initial distances to reset the pins so that when the slides are ultimately restored to the initial load position, the columns of pins are straightened. If more precise straightening is required, the article may be removed and rotated 90° and then subjected to another pin straightening operation to straighten the rows of pins.

BRIEF DESCRIPTION OF THE DRAWINGS

Other features and advantages of the invention will be understood upon consideration of the following detailed description when considered in conjunction with the drawings, wherein

FIG. 2 is a top view of an apparatus for straightening a coordinate array of terminal pins projecting from an article in accordance with the principles of the invention;

FIG. 3 is a side elevational view partially cut away of the pin straightening apparatus shown in FIG. 2 and particularly illustrating an actuating means for moving a pair of pin bending slide devices;

DETAILED DESCRIPTION

Figure 1:
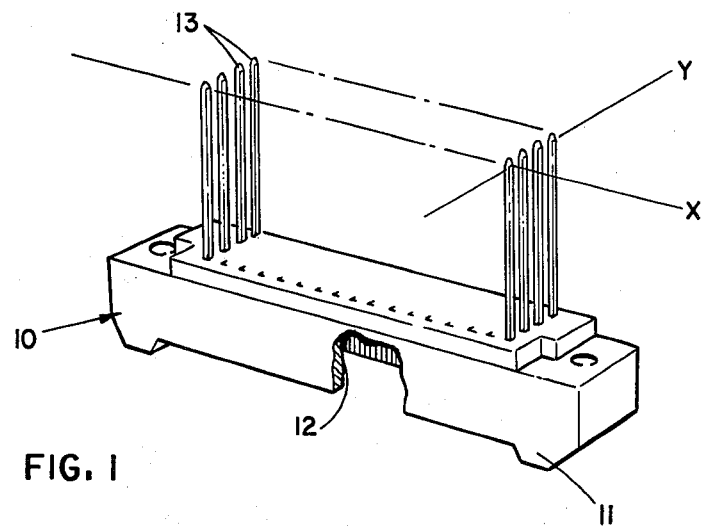
FIG. 1 is a perspective view of a connector with an array of projecting terminal pins which may be straightened in accordance with the method and apparatus of the present invention.

Referring to FIG. 1, there is shown a connector 10 having a body 11 with a socket opening 12 for receiving a series of contacts formed on an edge connector mounted on a printed circuit board or circuit pack. Mounted on and projecting from the body are a number of terminal pins 13 arranged in a coordinate array. In use, multitudes of these connectors 10 are mounted in a telephone switch frame to provide interconnections between discrete circuit boards and between the circuit boards and external circuitry. The interconnections may be provided by small connectors which engage sub-groups of the terminal pins 13 or by wires which may be wire wrapped about terminal pins on different connectors. In either situation, it is important that the terminal pins be straight and parallel to each other and project from the connector body 11 in an orthogonal array of columns and rows of pins.

Terminal pins of this general type which are constructed of resilient metal, such as phosphor bronze or beryllium copper may be straightened by flexing the rows of pins in first X-directions beyond elastic limits and then flexing the rows of pins in opposite X-directions beyond the elastic limits whereafter the pins are restored to the original positions. For many applications a single reciprocation in the X-directions is sufficient to leave the pins aligned in both the X and Y directions. Next, for more precise alignment the pins may be flexed in Y-directions beyond the elastic limits and then reverse flexed in opposite Y-directions beyond the elastic limits and, finally, restored to the original flex position. In other words, the pins are flex reciprocated in orthogonal directions to effectuate a precise straightening and an alignment of the pins in a coordinate array. In the prior art, the usual practice is to apply the bending or flexing forces in common directions to all the pins. The bending forces are cumulative in effect, and often result in the introduction of detrimental stresses which may damage the pin mountings or other parts of the connector.

The invention is concerned with a method and apparatus for alleviating the introduction of detrimental stresses in the connector by balancing the bending or flex forces during each flexing operation. This balancing is accomplished by applying half of the bending forces in a first direction to the terminal pins while simultaneously applying bending forces to the remainder of the pins in an opposite direction.

Figure 4:
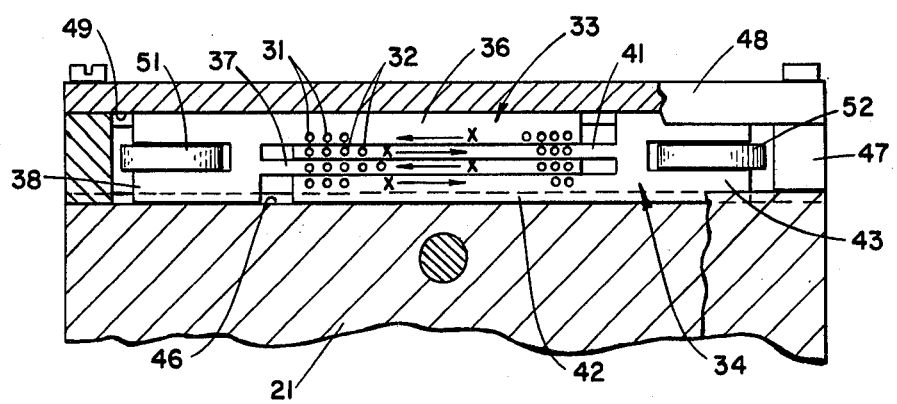
FIG. 4 is a front view taken along line 4—4 of FIG. 2 showing an interleaved arrangement of the slide devices.

An apparatus for practicing the method of the invention to attain the balancing of the bending forces is shown in FIGS. 2, 3 and 4, wherein the apparatus is mounted on a base 21 having a pair of clamp blocks 22 and 23, each of which is cut out to provide a recess 24 or 26 to receive a connector 10. Spring-loaded clamping bars 27 and 28 are mounted on the blocks 22 and 23 to hold the connector in position during a pin straightening operation. The clamping bars 27 and 28 are held by headed screw members 29 and 30 so that the ends of the bars cooperate with the recesses 24 and 26 to provide a pair of seats to receive the ends of a connector 10.

A connector 10 may be loaded into the seats provided by the recesses 26 and 24 by pressing the rear end of the connector against the spring-loaded clamping elements 27 and 28 which slide back to permit the positioning of terminals within flared-mouth circular bores 31 and 32 respectively formed in a pair of bending units 33 and 34. Bending unit 33 comprises two first horizontal slide bars 36 and 37 (see FIG. 4) that project from a mounting 38 while bending unit 34 comprises two second horizontal slide bars 41 and 42 projecting from a mounting 43. The first and second bars are interleaved with each other to permit movement in opposite directions, such as indicated by the arrows on the respective bars.

Each bar is formed with a row of holes, such as holes 31, which include a flared-mouth entry and a bore section of suitable shape and dimension, to receive a row of terminal pins. As shown in FIG. 4, the ends of the slide bars are spaced from the mountings 38 and 43 so that the slide bars may be reciprocated in opposite X-directions.

Looking at FIG. 3, it will be noted that the base 21 is machined to provide a guideway 46 to receive and slidably retain the mountings 38 and 43 and a portion of the lower slide bar 42. A pair of supports, one of which is designated by the reference numeral 47, extend from the base 21 and have mounted thereon a channel bar 48 with a guideway 49 for receiving the slide bar 36. Bending unit mountings 38 and 43 are bifurcated to provide slots into which extend end sections of levers 51 and 52. The ends of the levers are provided with elongated slots 53 and 54 to receive bending unit drive pins 56 and 57 which are secured in the mountings 38 and 43.

Levers 51 and 52 are pivotally mounted about their midsections on posts 61 and 62 which are secured in abutments 63 and 64 projecting from the base 21. The left ends of the levers 51 and 52 are connected by pins 66 and 67 to links 68 and 69 which, in turn, are coupled together by a pin 71 to form a toggle. Pin 71 is rotatably mounted in a pair of bifurcations 72 and 73 forming part of a clevis 74. The bottom bifurcation 72 and a portion of the clevis 74 are slidably mounted in a guideway 76 formed in the base 21. The clevis 74 is provided with a tapped hole 77 into which is received the threaded end of a piston rod 78. A lock nut 79 is provided to secure the adjustment of the piston rod 78 in the clevis 74.

The piston rod 78 extends into an air cylinder 81 which functions to initially move the piston rod 78 and the clevis 74 to flex the toggle and pivot the forward ends of the levers 51 and 52 outwardly away from each other thus horizontally moving the bending slides 33 and 34 in opposite directions to flex the terminals 13. The movement of the piston rod is set so that the individual slide bars 36 and 37 move in directions opposite to the movement of the slide bars 41 and 42 by amounts sufficient to bend the rows of terminal pins in opposite directions beyond the elastic limits so that each terminal pin is bent with a permanent mechanical set.

Air cylinder 81 is supported in a suspended position at its front or rod end by the piston rod 78, and its rear end by one arm 82 of an L-shaped bracket 83. A second arm 84 of the bracket 83 has a tapped hole 86 to receive the threaded end of a second piston rod 87. The adjustment of the piston rod 87 in the tapped hole 86 is secured by a lock nut 88. Piston rod 81 extends into a tandem air cylinder 89 that is mounted on an abutment 91 projecting from the base 21.

During an operating cycle of the apparatus, the air cylinder 81 is reverse operated to withdraw the piston rod 78, whereupon the bending units 33 and 34 are restored to their original position, thus reverse flexing the terminals backwardly from the positions of mechanical set to the original positions. Air cylinder 89 is now operated to withdraw piston rod 87 which, in turn, moves the air cylinder 81, the piston rod 78 and the clevis 74 toward the left to further collapse the toggle. As the toggle collapses, the levers 51 and 52 pivot to further move the slide bars 36, 37, 41 and 42 into interleaved relation. This reverse movement of the slide bars effectuates a resetting of the terminal pins by further flexing of the pins beyond elastic limits so that when the cylinder 89 is reoperated to restore the slide bars to the original positions, the natural resiliency of terminal pins 13 causes the pins to flex back into positions with the rows of pins being aligned and straightened.

In summary, the operation of the disclosed embodiment of the invention results in straightening and aligning the rows of pins. Normally, a single reciprocating bending cycle in opposite X-directions about the origin positions is all that is needed to align the terminal pins in a coordinate array of columns and rows. In certain situations, a more precise column alignment may be required so that it is necessary to stress bend the columns of terminal pins. In this instance, the columns of pins may be straightened and aligned by placing the connector in a second bending device similar to that disclosed. This second device will have opposite moving slide bars similar to the slide bars 36, 37, 41 and 42 but of a number sufficient to receive all of the columns of terminal pins 13 and will be reciprocated in opposite Y-directions.

It should be further noted that the initial bending by operation of the air cylinder 81 from the original points is much greater than the flexing of the terminal pins past the origin point by operation of the air cylinder 89. In general, the travel of the piston rod 78 driven by the air cylinder 81 will be approximately four times the travel imparted to the piston rod 87 by operation of the air cylinder 89. The operation of the air cylinder 89 insures that the reverse bending of the terminal pins is sufficient so that the pins are all bent beyond their elastic limits during the reverse bending operation.

Figure 5:
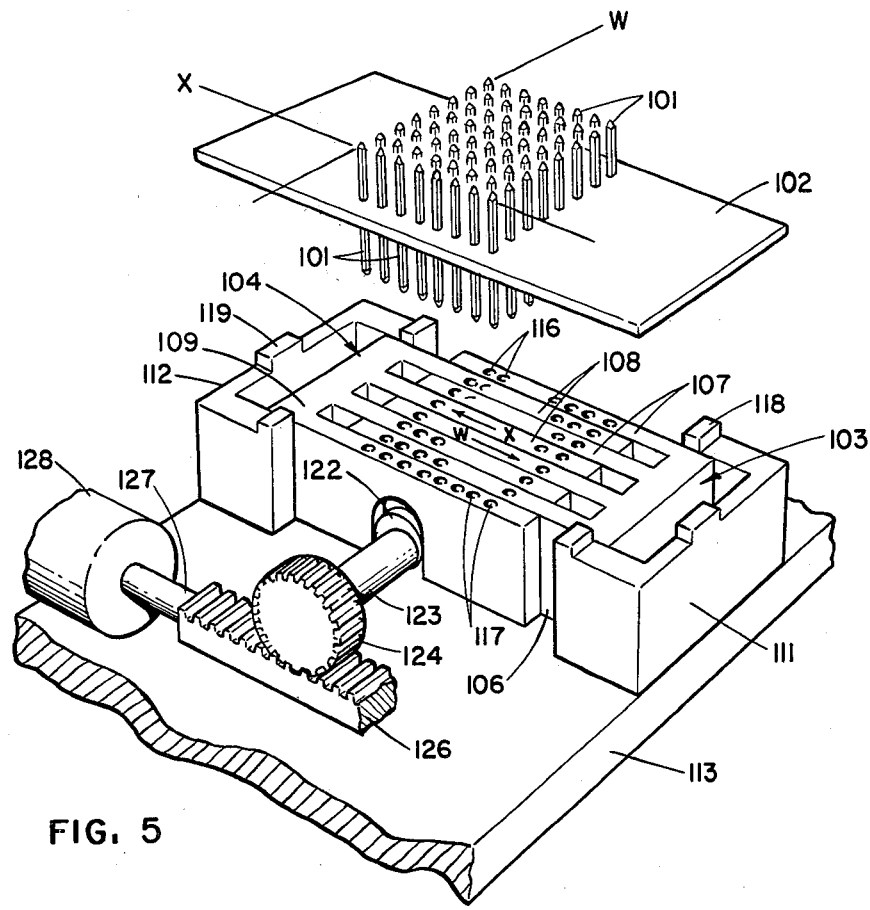
FIG. 5 is a perspective view of an alternative embodiment of the invention that is particularly adapted to straighten in orthogonal directions a coordinate array of terminal pins projecting through a printed circuit board.
Figure 6:
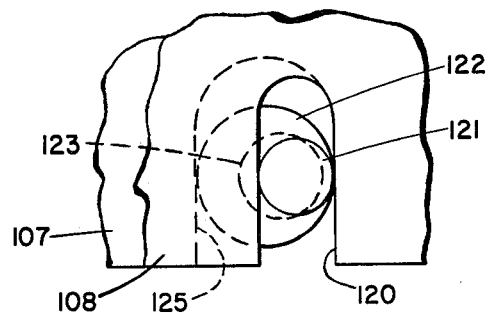
FIG. 6 is a front view of a pair of eccentrics for moving the slide devices in opposite directions.

Attention is directed to FIG. 5 wherein there is disclosed an alternative embodiment of the invention comprising a bending apparatus that is particularly adapted to bend and straighten a plurality of pins 101 extending through a printed circuit board 102 in accordance with the method of the invention. In this instance, a pair of bending units 103 and 104 similar to bending units 33 and 34 are again utilized to simultaneously bend half of the pins 101 in a first direction while the other half of the pins are bent in an opposite direction. Bending unit 103 comprises a mount section 106 from which projects a series of four or more bending slides 107 interleaved with a series of four or more bending slides 108 projecting from a second mount section 109. The ends of the slides 107 and 108 are spaced from the mounts 106 and 109 to permit the slides to be reciprocated relative to each other.

The bending units 103 and 104 are mounted for reciprocating movement within U-shaped guides 111 and 112 mounted on a base plate 113. The slides 107 are provided with rows of vertical bores 116 having flared entries to receive half of the pins 101, while the slides 108 are provided with rows of vertical bores 117 having flared entries to receive the remaining half of the projecting pins 101. A plurality of support blocks 118 are secured to the top of the guide block 111 and provide support for one end of the printed circuit board 102 when the pins 101 are positioned within the slide bores 116 and 117. In a like manner, a plurality of support blocks 119 are secured to the top of the guide 112 to support the other end of the circuit board 102 during a pin bending operation.

In order to reciprocate the slides, a pair of cams 121 and 122 are fitted within arch-like openings 120 and 125 formed in the outer slides 108 and 107. Cams 121 and 122 are mounted on a shaft 123 that is rotated by a gear 127 that meshes with a rack 126. This rack may be reciprocated by a piston rod 127 emanating from an air cylinder 128.

In use of this embodiment to practice the method of the invention, a circuit board is placed on the supports 118 and 119 with the pins 101 extending into the rows of vertical holes 116 and 117. The air cylinder 128 is operated to thrust the piston rod 127 and the rack 126 forward to rotate the gear 124 and the cams 121 and 122 in a counterclockwise direction. Rotation of the cams effectuates a forward movement of the slides 107 and 108 in the directions indicated by the arrows X and W to bend the pins 101 beyond the elastic limits. The slides 107 bend half of the pins in a first direction while the slides 108 bend the remaining half of the pins in an opposite direction. These bending forces act against each other and balance, so that there is, in effect, no detrimental forces imparted to the circuit board 102 freely mounted on the supports 118 and 119.

A reverse rotation of the cams 121 and 122 causes the slides 107 and 108 to move in the reverse direction to again bend the pins beyond the elastic limits. The air cylinder 128 is programmed to impart a further movement to the rack 126 to further rotate the gear 124 and the cams 121 and 122 in a clockwise direction. This further movement is approximately one-fourth to one-half the movement imparted to the cams during the initial forward and reverse bending of the pins. The air cylinder is further controlled to restore the gear and the cams to the initial position so that the pins 101 flex back into positions where the rows of pins are aligned, and each pin is straightened with respect to its X axis. Usually, it is expected that this single straightening cycle will be sufficient to not only align the pins in the X-direction, but also in the Y-direction.

If further alignment is desired or needed, the board 102 is then lifted and rotated 90° and again placed on the supports 118 and 119. The bending apparatus is operated to straighten the pins in Y-directions. Following these two bending operations, the pins are all straightened and aligned as a coordinate array.

It is further contemplated that the supports 118 and 119 may be eliminated, in which situation the bores 116 and 117 are formed to receive the pins and support the pins on the bottoms of the bores. The bores are of such depth that the board 102 is spaced above the slides 103 and 104. The programmed air cylinder 128 is again operated to reverse bend the pins beyond the elastic limits of the pin material in the X-directions and, if desired for more precise alignment, in the Y-directions.

What is claimed is:

1. A method of straightening a coordinate array of pins, which comprises:
   initially bending alternate rows of said pins in opposite directions beyond elastic limits; and then
   bending the alternate rows of pins in directions that are opposite to said initial directions beyond elastic limits.

2. A method of bending a coordinate array of pins, which comprises:
   imparting reciprocating bending forces to alternate first rows of pins to bend said pins beyond their elastic limits in opposite directions, while
   imparting reciprocating bending forces to the interleaved rows of pins in directions opposite the forces applied to the first rows of pins to bend the interleaved rows of pins beyond their elastic limits in opposite directions.

3. A method of aligning a coordinate array of pins projecting from a mounting, which comprises:
   receiving alternate rows of pins within bores formed in a first series of spaced slides, while receiving the remaining rows of pins within bores formed in a second series of slides interleaved between the first spaced slides; and
   reciprocating the first and second slides in opposite directions to bend the pins beyond their elastic limits in opposite directions during the reciprocation of the slides.

4. A method of aligning a coordinate array of pins as defined in claim 3, which comprises:
   removing the mounted pins from the bores in the slides;
   rotating the pin mount ninety degrees;
   reinserting the pins in the bores; and then
   again reciprocating the first and second slides in opposite directions to bend the pins beyond their elastic limits in opposite directions during the reciprocation of the slides.

5. A method of aligning a coordinate array of pins as defined in claim 3, wherein the slides are arranged to move the bores in parallel horizontal planes.

6. A method of aligning a coordinate array of pins as defined in claim 3, wherein the slides are arranged to move the bores in parallel vertical planes.

7. A method of aligning a coordinate array of pins as defined in claim 6, wherein the receiving step contemplates placing the pins in bores of limited depth to support the mount above the slides.

8. An apparatus for straightening a coordinate array of pins projecting from an article;
   a plurality of parallel slides, each of said slides having a row of holes for receiving a row of pins;
   first means for driving said slides to initially move alternate slides in opposite directions to initially bend alternate rows of pins in opposite directions; and
   second means for driving said slides to move alternate slides in directions opposite to said initial movement to bend alternate rows of pins in directions opposite to said initial bends.

9. An apparatus for bending a coordinate array of pins, which comprises:
   a first set of parallel slide members, each of said slide members having a row of holes for receiving a row of pins;
   a second set of parallel slide members interleaved with the first set of slide members, each of said second set of slide members having a row of holes for receiving a row of pins;
   means for reciprocating said first set of slide members; and
   means for simultaneously reciprocating said second set of members in opposite directions with respect to said first set of reciprocating slide members.

10. A pin straightening apparatus, which comprises:
    means for supporting a device with an array of pins projecting in common directions;
    first means having a plurality of holes for receiving one half of the pins;
    second means having a plurality of holes for receiving the remaining one half of the pins; and
    means for imparting relative motion between said first and second pin receiving means to bend one half of the pins in a first direction while simultaneously bending the remaining half of the pins in an opposite direction.

11. A pin straightening apparatus, as defined in claim 10, wherein the pins are arranged in rows and columns, and wherein said first receiving means comprises a first slide and the second receiving means comprises a second slide.

12. A pin straightening apparatus, as defined in claim 10, wherein said relative motion imparting means imparts a second relative motion between said first and second receiving means which is opposite in directions to the first relative motions.

13. A pin straightening apparatus, as defined in claim 10, wherein said first receiving means comprises a plurality of first slides each having a row of holes and being spaced apart in parallel relation; and said second receiving means comprises a plurality of second slides each having a row of holes and being positioned individually between said first slides.

14. A pin straightening apparatus, as defined in claim 13, wherein the number of first slides equal the number of second slides.

15. A pin straightening apparatus, as defined in claim 10, wherein the first slides are pivotally connected to a first end of a first lever, and the second slides are pivotally connected to a first end of a second lever, and which includes:
    a toggle joint interconnecting the second ends of the levers; and
    means for flexing the toggle joint to move the slides relative to each other.

16. A pin straightening apparatus, as defined in claim 10, wherein said first and second slides have openings therethrough which are contiguous with each other; and said relative motion imparting means includes:
    a plurality of cams for individually contacting the walls of individual openings; and
    means for rotating the cams to impart relative motion to said slides in opposite directions.

17. A pin straightening apparatus, as defined in claim 10, wherein said first means comprises a first block having a plurality of parallel slots to provide a plurality of first slide bars; and said second means comprises a second block having a plurality of parallel slots to provide a plurality of second slide bars nested between the first bars.

18. A pin straightening apparatus, as defined in claim 10, which includes:

means for guiding the slides to move in horizontal directions; and said slides have the slide holes extending horizontally from the top surfaces of said slides to receive the pins.

19. A pin straightening apparatus, as defined in claim 10, wherein the pin receiving holes are formed in a coordinate array of columns and rows.

20. An apparatus for straightening a coordinate array of pins extending from an article, which comprises:

a first set of parallel slides having first holes extending from a top surface thereof, said first holes being formed in a coordinate array of columns and rows for receiving a portion of the pins extending from the article;

a second set of parallel slides interleaved with the first set of slides and having second holes extending from a top surface thereof, said second holes being formed in a coordinate array of columns and rows with the rows of second holes being aligned with the rows of first holes for receiving the remaining pins extending from the article; and means for imparting reciprocating motions to said slides to move the first and second slides in opposite directions to initially flex the pins beyond their elastic limits, and then flex pins in opposite directions beyond their elastic limits.

* * * * *